United States Patent
Dvorak

(10) Patent No.: US 7,193,448 B2
(45) Date of Patent: Mar. 20, 2007

(54) WIDE DYNAMIC RANGE OPERATIONAL AMPLIFIER

(75) Inventor: Mark D. Dvorak, Waseca, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/191,173

(22) Filed: Jul. 9, 2002

(65) Prior Publication Data

US 2004/0008084 A1    Jan. 15, 2004

(51) Int. Cl.
    *H03K 5/22* (2006.01)
(52) U.S. Cl. .......................... 327/66; 327/65; 327/560; 330/257; 330/261
(58) Field of Classification Search ................ 330/151, 330/255, 264, 267, 292, 300, 285, 253, 260
    See application file for complete search history.

(56) References Cited

U.S. PATENT DOCUMENTS

| | | | | |
|---|---|---|---|---|
| 4,315,223 A | * | 2/1982 | Haque | 330/253 |
| 5,389,894 A | * | 2/1995 | Ryat | 330/255 |
| 5,446,412 A | * | 8/1995 | Kimyacioglu et al. | 330/255 |
| 5,900,780 A | * | 5/1999 | Hirose et al. | 330/253 |
| 6,388,519 B1 | * | 5/2002 | Tachimori | 330/253 |
| 6,560,980 B2 | * | 5/2003 | Gustafson et al. | 62/186 |
| 6,657,496 B2 | * | 12/2003 | Chen et al. | 330/263 |
| 2001/0026194 A1 | * | 10/2001 | Tomasini et al. | 330/264 |
| 2004/0008084 A1 | * | 1/2004 | Dvorak | 330/255 |

OTHER PUBLICATIONS

Paul R. Gray et al., "MOS Operational Amplifier Design—A Tutorial Overview", IEEE Journal of Solid-State Circuits, vol. SC-17, No. 6, Dec. 1982, pp. 969-982.

* cited by examiner

*Primary Examiner*—Tuan T. Lam
*Assistant Examiner*—Hiep Nguyen
(74) *Attorney, Agent, or Firm*—McDonnell Boehnen Hulbert & Berghoff LLP

(57) ABSTRACT

An operational amplifier has a bias circuit, a differential amplifier, an output stage, and a feed forward circuit. The bias circuit provides a reference. The differential amplifier is coupled to a pair of input terminals and provides a differential output based on the first and second inputs. The output stage responds to the reference and to the differential output so as to supply a current to an output terminal. The feed forward circuit responds to the differential output in order to increase and decrease current to the output terminal. As a result, the feed forward circuit extends the dynamic range of the operational amplifier.

28 Claims, 4 Drawing Sheets

WIDE DYNAMIC RANGE OPERATIONAL AMPLIFIER

TECHNICAL FIELD OF THE INVENTION

The present invention relates to an operational amplifier and, more particularly, to an operational amplifier having a wide dynamic range.

BACKGROUND OF THE INVENTION

Operational amplifiers have long been used as comparators, audio amplifiers, filters, etc. An operational amplifier is basically a differential amplifier that amplifies the difference between two inputs. One input has a positive effect on the output signal of the amplifier, and the other input has a negative effect on the output signal. Both inputs act on the output signal simultaneously, and the output signal is the sum of both inputs. Accordingly, if both inputs are equal, then the output signal is ideally zero.

An electronic system incorporating an operational amplifier is frequently required to operate with a large dynamic range. Typically, this requirement means that the electronic system must be able to function properly with signal levels ranging from a very small signal level to a very large signal level. In order for the electronic system to operate well when the signal level is small, the electronic system must introduce very little electronic noise. On the other hand, in order to handle large signals, the electronic system must behave in a very linear manner so as not to introduce any distortion into its output signal.

The present invention is directed to an operational amplifier with a wide dynamic range. Because operational amplifiers are used in a wide variety of electronic systems, the operational amplifier of the present invention is useful in many applications.

SUMMARY OF THE INVENTION

In accordance with one aspect of the present invention, an operational amplifier comprises a bias circuit, an input stage, an output stage, and a feed forward circuit. The bias circuit provides a reference. The input stage includes a differential amplifier and is coupled to a pair of input terminals so as to provide an output signal on a differential amplifier output. The output stage is coupled to the reference, to the differential amplifier output, and to an output terminal. The feed forward circuit is coupled to the differential amplifier output and to the output stage so as to extend the dynamic range of the operational amplifier.

In accordance with another aspect of the present invention, an operational amplifier comprises a differential amplifier, an output stage, and a feed forward circuit. The differential amplifier is coupled to a pair of input terminals and provides an output signal on a differential amplifier output. The output stage has a first active control element coupled between the differential amplifier output and an output terminal, and has a second active control element coupled between a reference and the output terminal. The feed forward circuit is coupled between the differential amplifier output and the second active control element so as to control increasing and decreasing of current to the output terminal in response to the output signal on the differential amplifier output.

In accordance with yet another aspect of the present invention, a method of supplying a differential output based upon first and second inputs comprises the following: supplying a reference bias to a first control element of an output stage of an operational amplifier; amplifying a difference between the first and second inputs so as to provide an output signal; controlling a second control element of the output stage in accordance with the output signal so as to control a current to an output terminal; and, adjusting the reference bias in accordance with the output signal in a feed forward manner so as to increase and decrease the current to the output terminal.

BRIEF DESCRIPTION OF THE DRAWING

These and other features and advantages will become more apparent from a detailed consideration of the invention when taken in conjunction with the drawings in which.

DETAILED DESCRIPTION

Figure 1:
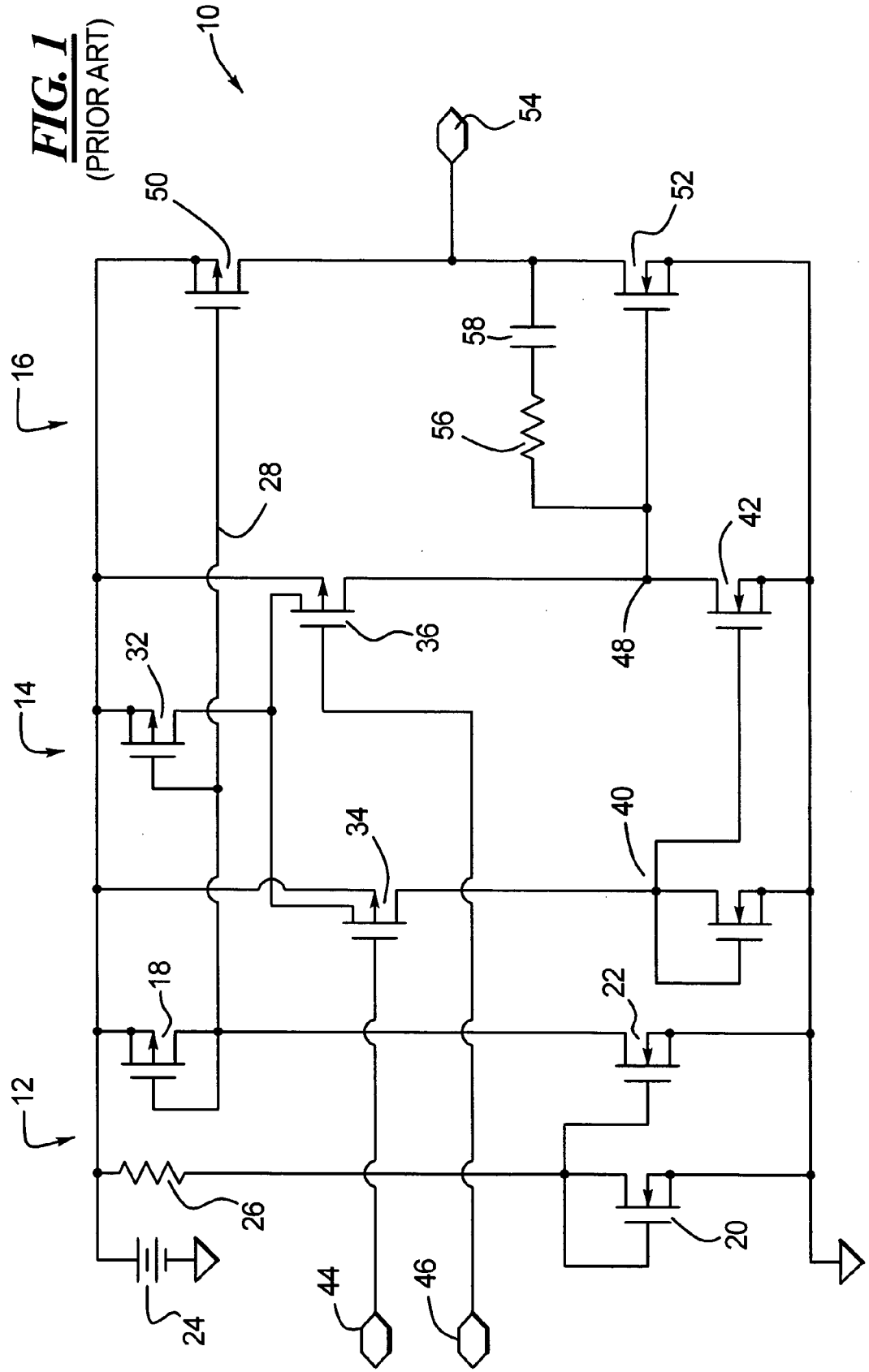
FIG. 1 illustrates a standard two-stage operational amplifier.

An operational amplifier 10 as shown in FIG. 1 is a standard two-stage operational amplifier and includes a bias circuit 12, an input stage 14, and an output stage 16. The bias circuit 12 includes a p-channel transistor 18 and two n-channel transistors 20 and 22. The drain and gate regions of the n-channel transistor 20 are coupled together and to a source 24 through a resistor 26. The gate and drain regions of the p-channel transistor 18 are coupled together and to the drain region of the n-channel transistor 22 whose gate region is coupled to the gate and drain regions of the n-channel transistor 20. The bias circuit 12 creates a reference voltage on a reference line 28 for the output stage 16.

The input stage 14 includes three p-channel transistors 32, 34, and 36 and two n-channel transistors 40 and 42. The gate region of the p-channel transistor 32 is coupled to the reference line 28, and the drain region of the p-channel transistor 32 is coupled to the source regions of the p-channel transistors 34 and 36. The gate region of the p-channel transistor 34 is coupled to a first input terminal 44 of the operational amplifier 10, and the gate region of the p-channel transistor 36 is coupled to a second input terminal 46 of the operational amplifier 10. The gate and drain regions of the n-channel transistor 40 are coupled together, to the drain region of the p-channel transistor 34, and to the gate region of the n-channel transistor 42. The drain region of the p-channel transistor 36 is coupled to the drain region of the n-channel transistor 42. The two p-channel transistors 34 and 36 form a differential amplifier having an amplifier output 48. Accordingly, the two p-channel transistors 34 and 36 form a difference between the signals on the first and second input terminals 44 and 46 and supplies this difference as a signal to the amplifier output 48.

The output stage 16 includes a p-channel transistor 50 and an n-channel transistor 52. The gate region of the p-channel transistor 50 is coupled to the reference line 28, and the drain region of the p-channel transistor 50 is coupled to an output terminal 54 of the operational amplifier 10. The gate region of the n-channel transistor 52 is coupled to the amplifier output 48, and the drain region of the n-channel transistor 52 is coupled to the output terminal 54. A resistor 56 and a capacitor 58 are coupled in series between the amplifier output 48 and the output terminal 54. The p-channel transistor 50 acts as an active load, and the n-channel transistor 52 is an amplifier for the signal on the amplifier output 48. The resistor 56 and the capacitor 58 are used to set the gain and phase performance of the operational amplifier 10.

Figure 2:
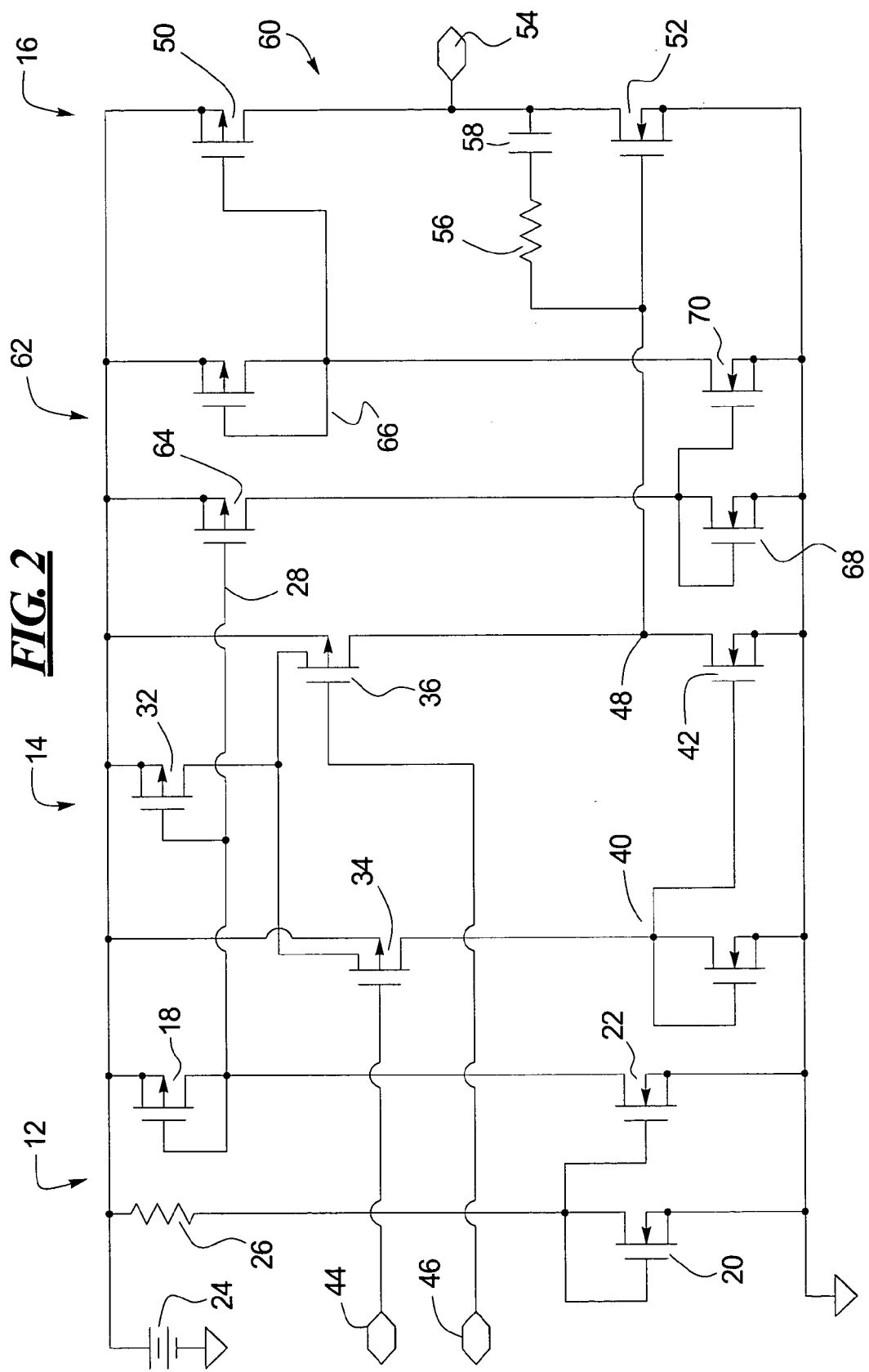
FIG. 2 illustrates the two-stage operational amplifier of FIG. 1 incorporating a current mirror.

An operational amplifier 60 is shown in FIG. 2 and is similar to the operational amplifier 10 shown in FIG. 1, differing only by the addition of a current mirror 62. Accordingly, the same reference numerals are used in both FIGS. 1 and 2 to depict the same elements and to better illustrate the similarities, and highlight the differences, between the operational amplifier 10 and the operational amplifier 60.

The current mirror 62 includes two p-channel transistors 64 and 66 and two n-channel transistors 68 and 70. The gate region of the p-channel transistor 64 is coupled to the reference line 28, and the drain region of the p-channel transistor 64 is coupled to the gate and drain regions of the n-channel transistor 68. The gate and drain regions of the p-channel transistor 66 are coupled together and to the drain region of the n-channel transistor 70 whose gate region is coupled to the gate and drain regions of the n-channel transistor 68. The gate and drain regions of the p-channel transistor 66 are also coupled to the gate region of the p-channel transistor 50.

The current mirror 62 converts the voltage reference provided by the bias circuit 12 on the reference line 28 to a current. This current is mirrored and is used to create another reference voltage for the p-channel transistor 50 of the output stage 16.

Figure 3:
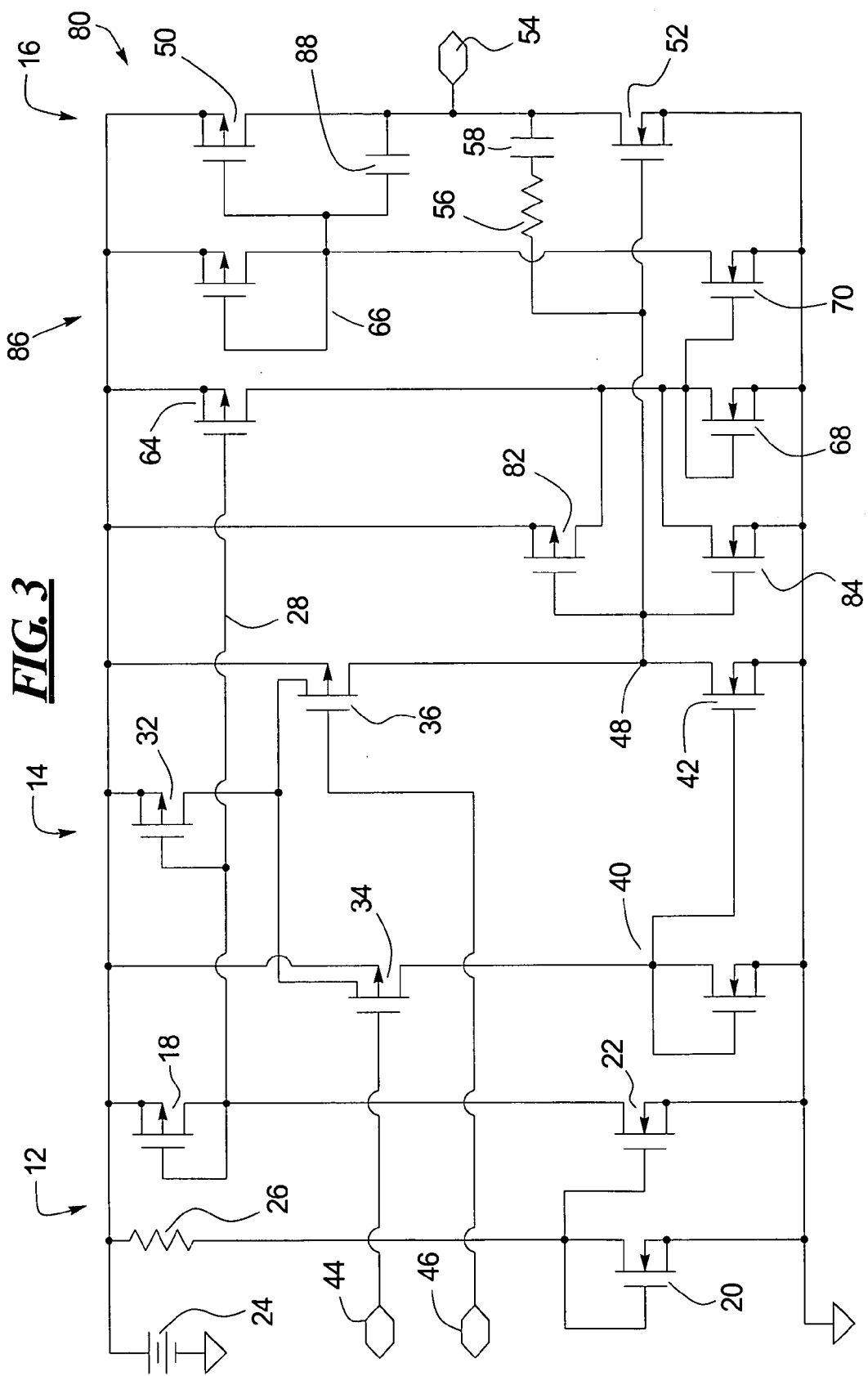
FIG. 3 illustrates the two-stage operational amplifier of FIG. 2 modified so as to include a feed forward circuit; and, FIG. 4 illustrates the two-stage operational amplifier of FIG. 3 incorporating input bias cancellation.

An operational amplifier 80 is shown in FIG. 3 and is the same as the operational amplifier 60 shown in FIG. 2 except for the addition of a p-channel transistor 82 and an n-channel transistor 84 that converts the current mirror 62 into a feed forward circuit 86. Accordingly, the same reference numerals are used in both FIGS. 2 and 3 to depict the same elements and to better illustrate the similarities, and highlight the differences, between the operational amplifier 60 and the operational amplifier 80.

The gate region of the p-channel transistor 82 and the gate region of the n-channel transistor 84 are coupled together, to the amplifier output 48 (i.e., the output of the differential amplifier formed by the p-channel transistors 34 and 36), and to the gate of the n-channel transistor 52. The drain region of the p-channel transistor 82 and the drain region of the n-channel transistor 84 are coupled together, to drain region of the p-channel transistor 64, to the gate and drain regions of the n-channel transistor 68, and to the gate region of the n-channel transistor 70. The feed forward circuit 86, therefore, comprises the p-channel transistors 64, 66, and 82 and the n-channel transistors 68, 70, and 84. In addition, a capacitor 88 is coupled between the gate and drain regions of the p-channel transistor 50 of the output stage 16 in order to provide compensation so as to preserve the gain and phase performance of the operational amplifier 80.

The feed forward circuit 86 monitors the output on the amplifier output 48 of the input stage 14 and dynamically changes the bias current supplied by the p-channel transistor 50 of the output stage 16 to the output terminal 54. Thus, when the output of the input stage 14 is high, the feed forward circuit 86 decreases the bias current in the output stage 16, thereby reducing the current supplied by the p-channel transistor 50. On the other hand, when the output of the input stage 14 is low, the feed forward circuit 86 increases the current in the p-channel transistor 50, making more current available to source an external load coupled to the output terminal 54. The overall effect of this operation is to significantly improve the distortion performance of the operational amplifier 80 in a manner that negligibly decreases its noise performance.

Figure 4:
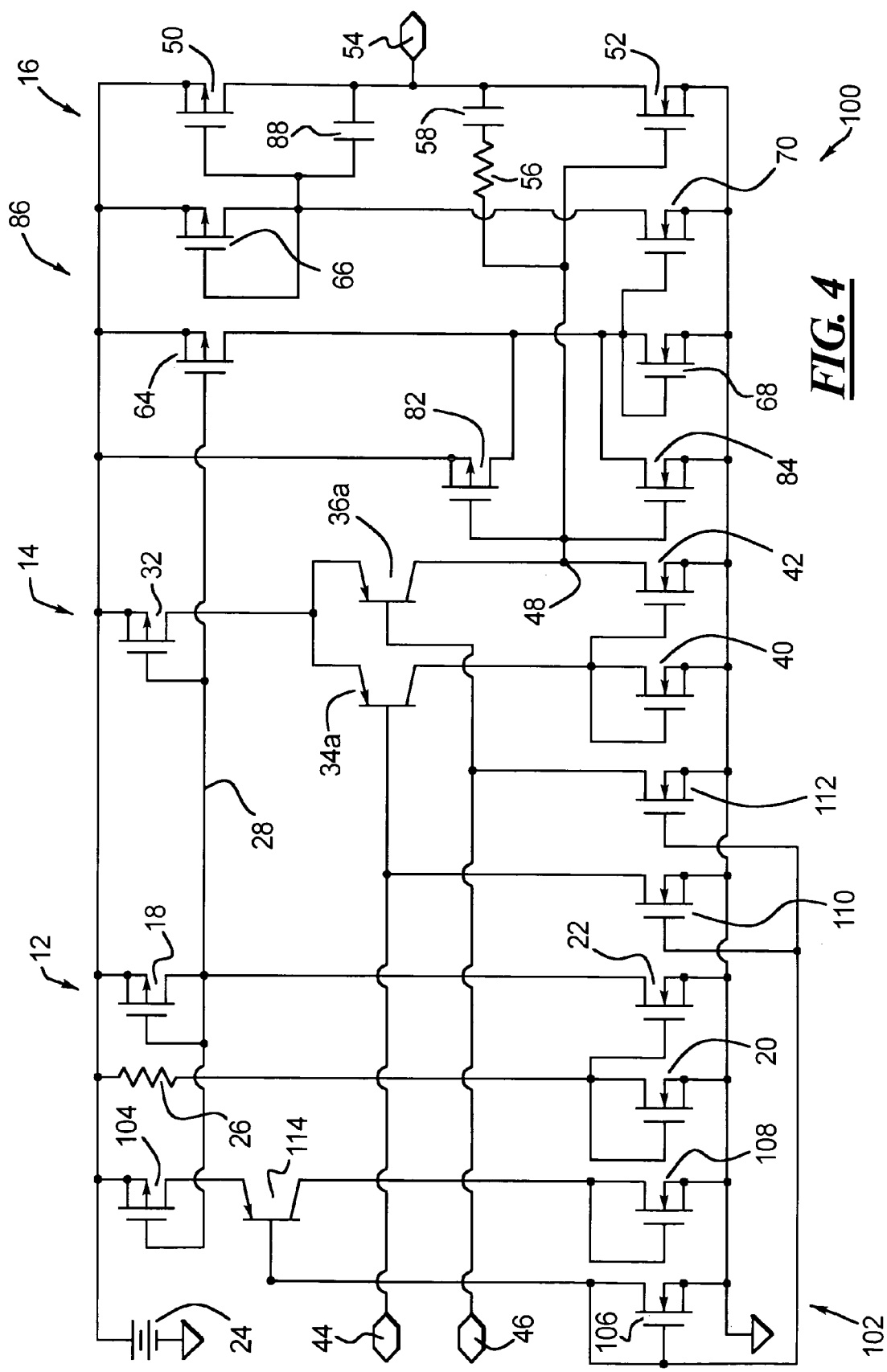

An operational amplifier 100 is shown in FIG. 4 and is the same as the operational amplifier 80 shown in FIG. 3 except for the addition of an input bias cancellation circuit 102 comprising a p-channel transistor 104, four n-channel transistors 106, 108, 110, and 112, and a lateral PNP (LPNP) transistor 114. In addition, the p-channel transistors 34 and 36 have been replaced by corresponding LPNP transistors 34a and 36a in order to lower flicker noise in the operational amplifier 100. Otherwise, the same reference numerals are used in both FIGS. 3 and 4 to depict the same elements and to better illustrate the similarities, and highlight the differences, between the operational amplifier 80 and the operational amplifier 100.

The gate region of the p-channel transistor 104 is coupled to the reference line 28, and the drain region of the p-channel transistor 104 is coupled to the emitter of the LPNP transistor 114. The collector of the LPNP transistor 114 is coupled to the gate and drain regions of the n-channel transistor 108. The gate and drain regions of the n-channel transistor 106 are coupled together, and to the gate regions of the n-channel transistors 110 and 112. The drain region of the n-channel transistor 110 is coupled to the first input terminal 44, and the drain region of the n-channel transistor 112 is coupled to the second input terminal 46.

The input bias cancellation circuit 102 is provided to cancel the base current of the LPNP transistors 34a and 36a in a manner which tracks process variations in the Beta parameter of the LPNP transistors, while not adding substantial noise.

Accordingly, the operational amplifiers 80 and 100 minimize the noise that is typically introduced by operational amplifiers and at the same time the operational amplifiers 80 and 100 minimize distortion. The feed forward circuit 86 of the operational amplifiers 80 and 100 makes more current available at the output terminal 54 when more current is required for the load, and reduces current from the output terminal 54 when less current is required for the load. The resistor 56 and the capacitor 58 maintain an acceptable AC response and ensure stable amplifier operation.

Certain modifications and/or alternatives of the present invention have been discussed above. Other modifications and/or alternatives will occur to those practicing in the art of the present invention. For example, specific types of transistors have been described above for the bias circuit 12, the input stage 14, the output stage 16, the feed forward circuit 86, and the input bias cancellation circuit 102. However, other types of transistors or other active devices can be used for the bias circuit 12, the input stage 14, the output stage 16, the feed forward circuit 86, and/or the input bias cancellation circuit 102.

Moreover, fewer or more stages and/or circuits and/or elements than those described herein may be used for the present invention. Therefore, if a claim recites fewer stages and/or circuits and/or elements than those shown in the drawings and described above, such claim should not be interpreted as including any omitted stage, circuit, and/or element.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. An operational amplifier comprising:
    a bias circuit arranged to provide a first voltage reference;
    an input stage including a differential amplifier, wherein the input stage is coupled to a pair of input terminals and is arranged to provide an output signal on a differential amplifier output;
    an output stage comprising first and second transistors and an output terminal, wherein only the second transistor of the first and second transistors is coupled to the differential amplifier output so as to directly receive the output signal, and wherein the output terminal is coupled between the first and second transistors;
    a feed forward amplifier coupled from the differential amplifier output and the bias circuit to the first transistor so as to extend the dynamic range of the operational amplifier, wherein the feed forward amplifier includes a current mirror that converts the first voltage reference to a current reference and back to a second voltage reference for supply to the output stage so that only the first transistor of the first and second transistors receives the second voltage reference; and
    an input bias cancellation circuit arranged to cancel base currents of at least one transistor within the input stage so as to track variations in Beta.

2. The operational amplifier of claim 1 wherein the feed forward amplifier is arranged to drive the output stage so as to provide more current when a load coupled to the output terminal requires more current and to drive the output stage so as to reduce current when the load coupled to the output terminal requires less current.

3. The operational amplifier of claim 2 wherein the feed forward amplifier is arranged to control the second voltage reference supplied to the output stage so as to drive the output stage to provide more current when a load coupled to the output terminal requires more current and to drive the output stage to reduce current when the load coupled to the output terminal requires less current.

4. The operational amplifier of claim 1 wherein the feed forward amplifier further includes third and fourth transistors coupled between the differential amplifier output and the current mirror.

5. The operational amplifier of claim 1 wherein the output stage includes a compensation circuit to set the gain and phase of the operational amplifier.

6. The operational amplifier of claim 5 wherein the compensation circuit comprises a resistor and a capacitor.

7. The operational amplifier of claim 1 wherein the feed forward amplifier is arranged to drive the output stage so as to provide more current when a load coupled to the output terminal requires more current and to drive the output stage so as to reduce current when the load coupled to the output terminal requires less current, and wherein the feed forward amplifier includes a transistor circuit coupled between the differential amplifier output and the current mirror.

8. The operational amplifier of claim 7 wherein the feed forward amplifier is arranged to control the second voltage reference supplied to the output stage so as to drive the output stage to provide more current when a load coupled to the output terminal requires more current and so as to drive the output stage to reduce current when the load coupled to the output terminal requires less current.

9. The operational amplifier of claim 1 wherein the feed forward amplifier is arranged to drive the output stage so as to provide more current when a load coupled to the output terminal requires more current and to drive the output stage so as to reduce current when the load coupled to the output terminal requires less current, and wherein the output stage includes a compensation circuit to set the gain and phase of the operational amplifier.

10. The operational amplifier of claim 9 wherein the feed forward amplifier is arranged to control the second voltage reference supplied to the output stage so as to drive the output stage to provide more current when a load coupled to the output terminal requires more current and to drive the output stage to reduce current when the load coupled to the output terminal requires less current.

11. The operational amplifier of claim 1 wherein the feed forward amplifier includes a pair of transistors having gates coupled to the differential amplifier output and output terminals coupled to the current mirror.

12. The operational amplifier of claim 11 wherein the compensation circuit comprises a resistor and a capacitor.

13. The operational amplifier of claim 1 wherein the feed forward amplifier is arranged to drive the output stage so as to provide more current when a load coupled to the output terminal requires more current and to drive the output stage so as to reduce current when the load coupled to the output terminal requires less current, wherein the output stage includes a compensation circuit to set the gain and phase of the operational amplifier, and wherein the feed forward amplifier includes third and fourth transistors coupled between the differential amplifier output and the current mirror.

14. The operational amplifier of claim 13 wherein the compensation circuit comprises a resistor and a capacitor.

15. The operational amplifier of claim 13 wherein the third transistor is arranged to control the second voltage reference supplied to the output stage so as to drive the output stage to provide more current when a load coupled to the output terminal requires more current and wherein the fourth transistor is arranged to control the second voltage reference supplied to the output stage so as to drive the output stage to reduce current when the load coupled to the output terminal requires less current.

16. The operational amplifier of claim 1 wherein the bias circuit, the output stage, and the feed forward amplifier include p-channel and n-channel transistors, and wherein the differential amplifier comprises bipolar transistors.

17. An operational amplifier comprising:
    a differential amplifier coupled to a pair of input terminals and having a single differential amplifier output, wherein the single differential amplifier output is arranged to provide an output signal;
    an output stage having first and second active control elements coupled to an output terminal, wherein the second active control element is coupled between the single differential amplifier output and the output terminal; and,
    a feed forward circuit coupling the single differential amplifier output and a reference to the first active control element, wherein the feed forward circuit includes first, and second, and third transistors, wherein each of the first and second transistors has a gate coupled to the single differential amplifier output, wherein the third transistor has a gate coupled to the reference, wherein the first, second, and third transistors have outputs coupled together, and wherein the feed forward circuit is arranged to control increasing and decreasing of current to the output terminal in response to the output signal on the differential amplifier output.

18. The operational amplifier of claim 17 wherein the first active control element comprises a transistor having a gate and a source/drain circuit, wherein the second active control element comprises a transistor having a gate and a source/drain circuit, wherein the gate of the second active control element is coupled to the differential amplifier output, wherein the gate of the first active control element is coupled to the feed forward circuit, and wherein the source/drain circuit of the first active control element and the source/drain circuit of the second active control element are coupled to the output terminal.

19. The operational amplifier of claim 17 wherein the output stage includes a compensation circuit to set the gain and phase of the operational amplifier.

20. The operational amplifier of claim 19 wherein the compensation circuit comprises a resistor and a capacitor.

21. The operational amplifier of claim 19 wherein the first active control element comprise a fourth transistor having a gate and a source/drain circuit, wherein the second active control element comprises a fifth transistor having a gate and a source/drain circuit, wherein the gate the fifth transistor is coupled to the differential amplifier output, wherein the gate of the fourth transistor is coupled to the feed forward circuit, and wherein the source/drain circuit of the fourth transistor and the source/drain circuit of the fifth transistor are coupled to the output terminal.

22. The operational amplifier of claim 21 wherein the compensation circuit comprises a resistor and a capacitor.

23. The operational amplifier of claim 17 wherein the output stage and the feed forward circuit include p-channel and n-channel transistors, and wherein the differential amplifier comprises bipolar transistors.

24. The operational amplifier of claim 17 wherein each of the first and second active control elements comprises a corresponding transistor.

25. A method of supplying an output current to an output terminal based upon first and second inputs comprising:
   supplying a reference bias to only a first control element of an output stage of an operational amplifier;
   amplifying a difference between the first and second inputs so as to provide a differential output;
   controlling a second control element of the output stage in accordance with the differential output so as to control the output current to the output terminal;
   adjusting the reference bias in accordance with the differential output in a feed forward manner with an amplifier so as to increase and decrease the current to the output terminal; and,
   canceling base currents of a pair of bipolar transistors of the differential amplifier so as to track variations in Beta.

26. The method of claim 25 further comprising setting the gain and phase of the operational amplifier.

27. The method of claim 25 wherein each of the first and second active control elements comprises a corresponding transistor.

28. An operational amplifier comprising:
   a transistor bias circuit coupled to a voltage supply and arranged to output a reference voltage;
   an input stage including a differential amplifier, wherein the input stage is coupled to a pair of input terminals and is arranged to provide an output signal on a differential amplifier output;
   an output stage comprising first and second transistors and an output terminal, wherein the second transistor is coupled to the differential amplifier output so as to receive the output signal, and wherein the output terminal is coupled between the first and second transistors;
   a current mirror, wherein the current mirror is coupled between the bias circuit and the first transistor, and wherein the current mirror converts the reference voltage to a reference current and converts the current reference to a bias voltage for supply to the first transistor; and,
   third and fourth transistors having control terminals coupled to the differential amplifier output and output terminals coupled to the current mirror.

* * * * *